United States Patent
Maury et al.

(10) Patent No.: US 6,309,900 B1
(45) Date of Patent: Oct. 30, 2001

(54) TEST STRUCTURES FOR TESTING PLANARIZATION SYSTEMS AND METHODS FOR USING SAME

(75) Inventors: Alvaro Maury; Frank Miceli; Subramanian Karthikeyan, all of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/480,387

(22) Filed: Jan. 11, 2000

(51) Int. Cl.[7] ............................ H01L 21/66; G01R 31/26
(52) U.S. Cl. .................................................. 438/16; 257/48
(58) Field of Search .................................. 418/16; 257/48

(56) References Cited

U.S. PATENT DOCUMENTS

| | | |
|---|---|---|
| 5,891,799 | 4/1999 | Tsui . |
| 5,952,674 * | 9/1999 | Edelstein et al. ................ 257/48 |
| 5,953,626 | 9/1999 | Hause et al. . |
| 5,960,305 | 9/1999 | Kumar . |
| 5,960,311 | 9/1999 | Singh et al. . |

FOREIGN PATENT DOCUMENTS

11233430-A  *  8/1999  (JP) .

* cited by examiner

*Primary Examiner*—Charles Bowers
*Assistant Examiner*—Asok Kumar Sarkar
(74) *Attorney, Agent, or Firm*—Alston & Bird LLP

(57) ABSTRACT

Test structures are disclosed for use in a system and with an associated method to test the effectiveness of planarization systems used in the fabrication of semiconductor devices and integrated circuits. A method of creating the test structure utilizes traditional semiconductor fabrication techniques, but uses substantially similar materials, such as oxide, for each of the layers of the test structure. Because the test structure comprises layers of substantially the same material, reliable uniform measurements of the thickness of the test structure may be obtained by an optical metrology tool. These measurements may then be analyzed and displayed in tabular reports or multi-dimensional plots to judge the effectiveness of the planarization system.

4 Claims, 4 Drawing Sheets

TEST STRUCTURES FOR TESTING PLANARIZATION SYSTEMS AND METHODS FOR USING SAME

FIELD OF THE INVENTION

The present invention relates generally to the planarization of surfaces in integrated circuit fabrication.

BACKGROUND OF THE INVENTION

As microelectronic device dimensions continue to shrink, patterning problems increasingly hinder integrated circuit and semiconductor device fabrication. Semiconductor device fabrication often requires extremely planar surfaces and thin films of precise thickness. The surfaces requiring planarization and thickness control in semiconductor devices include areas or layers of dielectric material (such as $SiO_2$) on the surface of semiconducting materials and other device pattern layers. The insulating dielectric layers and other device layers need to be extremely planar because irregularities and rough topography lead to fabrication problems, including Depth of Focus budget (hereafter DOF) problems. Since an irregularity in the surface can cause part of the surface to be out of focus at a particular distance between the optical system and the wafer, errors in pattern formations can occur. Also, the thickness of layers needs to be precisely controlled because variations in thickness may affect the electrical properties of the layers and adjacent device patterns, particularly in the interconnections between the different layers of microelectronic devices.

The precise control of layer thickness is also crucial in semiconductor device fabrication. In VLSI technology, for instance, certain layers of multi-layer devices are generally electrically interconnected. These layers are also typically insulated from various levels by thin layers of insulating material (such as $SiO_2$). In order to interconnect the device layers, contact holes are often formed in the insulating layers to provide electrical access therebetween. If the insulating layer is too thick, the layers may not connect, if the layer is too thin, the hole formation process may damage the underlying device layer.

For normal semiconductor device fabrication, the device layer comprises of a conductor such as aluminum. This conductive material layer is then patterned so that the portions of the device layer that remain are individual conductors that are separated by voids. The individual conductors are subsequently isolated from each other and from a subsequent metal level by deposition of a dielectric layer that fills the voids or spaces between adjacent metal lines, and leaves an insulating layer on top of the conductors. The conductors and voids that underlie the inter-level dielectric layer affect the leveling of the inter-level dielectric layer. Planarization systems are then needed to level the inter-level dielectric layer so that a stack of conductive layers and dielectric layers may be fabricated without DOF and other problems.

Chemical-mechanical polishing (CMP) is an often employed planarization technique for limiting variations of layer thickness in integrated circuit and semiconductor device fabrication. These variations in layer thickness are often induced by the underlying topography of a patterned device layer which creates peaks and valleys in layers that are deposited above it. Generally, CMP is a technique of planarizing wafers through the use of a polishing pad attached to a rotating table. The wafer is held by a chuck above a polishing pad which rotates on a spindle. The wafer is pressed downward against the polishing pad. The nap of the rotating pad removes bits of the film layer, thereby planarizing the surface. A solution of pH controlled fluid and colloidal silica particles called slurry flows between the pad and the wafer to remove material from the polishing area and to enhance the planarization of the wafer surface.

To ensure that an employed planarization system, such as CMP, is continuing to produce acceptable planarization results, periodic tests are conducted on layers that have been subjected to the polishing step. Planarity tests may also be conducted when establishing new fabrication processes or when comparing the planarization ability of different planarization systems or when evaluating maintenance needs of an existing planarization system (for instance, the effectiveness of a CMP system may decrease when the polishing pad needs to be replaced).

Currently, techniques for testing a planarization system examine a layer in a semiconductor wafer (which may or may not include circuit elements, such as an integrated circuit) that has been subjected to the planarization system. One technique uses a scanning electron microscope (SEM) on cross-sections of the semiconductor wafer to take thickness measurements of the layers. Another technique uses an optical metrology tool that emits an incident light beam and measures the reflected light from the top surface of the inter-level dielectric layer and from the interface of the inter-level dielectric layer and an underlying layer to take thickness measurements of the inter-level dielectric layer. Unfortunately, these testing techniques have limitations that reduce their desirability.

The SEM technique is very time consuming, highly localized, and does not allow rapid characterization of a planarization system because of the time required to prepare the semiconductor wafer for scanning. The optical metrology technique's accuracy is effected by the location on the semiconductor device where the measurement is taken. Most optical probes have a spot size, smallest zone of focus, of about five to ten micrometers while the patterned device features fabricated on the underlying layer (e.g., substrate) may have dimensions on the order of one micrometer or less. For example, the conductors of a metal layer in a semiconductor device may be around one micrometer in size. Because of the small size of the conductors, multiple conductors may exist in any five to ten micrometers zone of focus. Therefore, a portion of the incident light is reflected by the features at a first depth and a portion of the incident light is reflected by the substrate at a second depth different form the first depth. This difference in the depth of the surfaces reflecting the light has dramatic effects on the accuracy of the measurement taken by the probe. Further, typical VLSI devices have very few suitable areas where the underlying metal pad is larger than the optical tool's spot size, and measurements can be taken. This reduces significantly the ability to obtain dielectric layer thickness information across a whole die and/or wafer.

While some optical metrology tools may have smaller spot size, they are typically much more expensive than those with larger spot size. In addition, even if optical probes with very small spot sizes are used, efforts still must be expended to ensure that the optical probe is positioned over a location on the semiconductor device or integrated circuit that is desired to be measured, for example, where there is no underlying feature that would deteriorate the optical measurement of thickness.

Therefore, an unsatisfied need still exists for systems and methods to test the planarity of layers of semiconductor devices and integrated circuits, that are less time consuming, less laborious, and more accurate.

SUMMARY OF THE INVENTION

The present invention provides test structures for use in a system and with an associated method to characterize the effectiveness of planarization systems. The test structure comprises a semiconductor wafer with two or more layers of optically matched materials, which are materials having substantially the same optical properties including extinction coefficient (k) and complex index of refraction (ñ). Therefore, optical measurements of the thickness of the layers can be taken at virtually any location about the surface of the wafer without concern for interference or deterioration of the optical metrology measurement.

The present invention provides a method for fabricating a test structure, for evaluating planarization systems, in which a patterned layer of a first material is formed over a substrate, the patterned layer includes a first topology; and a second material is deposited over the patterned layer, the second material having a second topology and the first material and the second material being optically matched to reduce reflection.

Other features and advantages of the present invention will become apparent to one with skill in the art upon examination of the following drawings and detailed description. It is intended that all such additional features and advantages be included herein in the scope of the present invention, as defined by the claims.

DETAILED DESCRIPTION

The present invention will now be described more fully hereinafter with reference to the accompanying drawings, in which preferred embodiments of the invention are shown. This invention may, however, be embodied in different forms and should not be construed as limited to the embodiments as set forth herein. Rather, these embodiments are provided so that this disclosure will be thorough and complete, and will fully convey the scope of the invention to those skilled in the art. The elements of the drawings are not necessarily to scale, emphasis instead being placed upon clearly illustrating the principles of the present invention. Furthermore, like reference numbers refer to like elements throughout.

Figure 1:
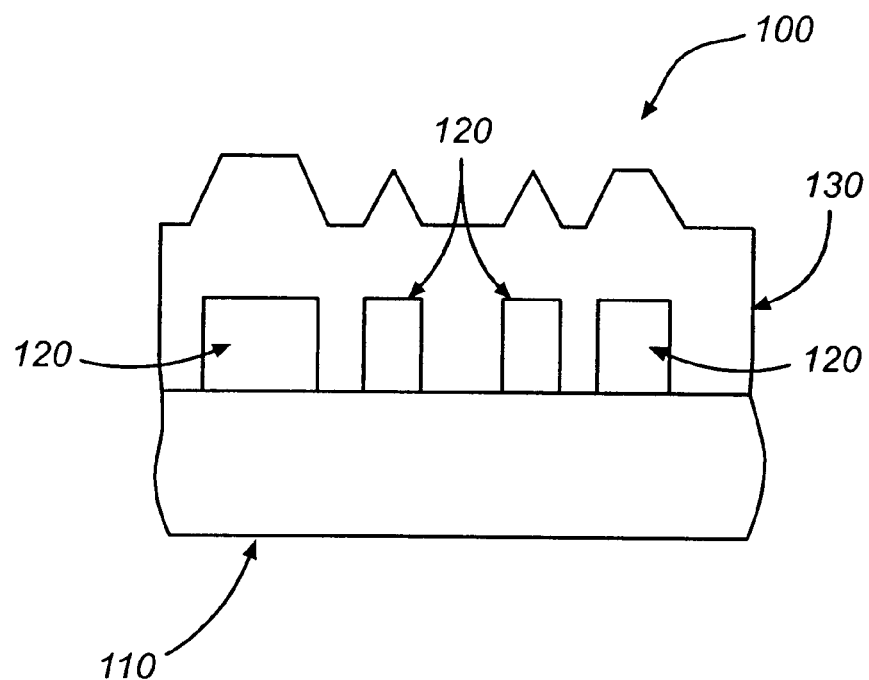
FIG. 1 illustrates a test structure in accordance with an embodiment of the present invention.

Referring now to FIG. 1, a test structure 100 according to one embodiment of the present invention that may be used in evaluating the planarity achieved by a planarization system is illustrated. As shown, the test structure 100 includes a substrate layer 110, a patterned layer 120 (e.g., a first material layer that has been etched) that has been deposited over the substrate layer 110, and a second material layer 130 that has been deposited over the patterned layer 120. It is noted, however, one of ordinary skill in the art will recognize that a test structure according to the present invention may have additional and/or other equivalent layers other than those illustrated and discussed herein, yet does not depart from the present invention.

The substrate 110 preferably comprises a material capable of reflecting the light from an optical metrology tool, such as a metal or silicon. The patterned layer 120 and the second material layer 130 comprise optically matched materials, preferably substantially the same material, so that the incident light and the light reflected off the substrate from an optical metrology tool will experience similar and/or predictable optical transmission throughout the measured layer, which may be thought of as a single optical layer comprising the patterned layer 120 and the second material layer 130, of the test structure 100. For purposes of the present invention, the patterned layer 120 and the second material layer 130 are optically matched when they have substantially similar optical constants including extinction coefficient (k) and complex index of refraction (ñ). Thus, regardless of where on the test structure 100 that the measurement is taken or of the spot size of the optical probe used, the measurement will accurately reflect the thickness of the measured layer.

Figure 2A:
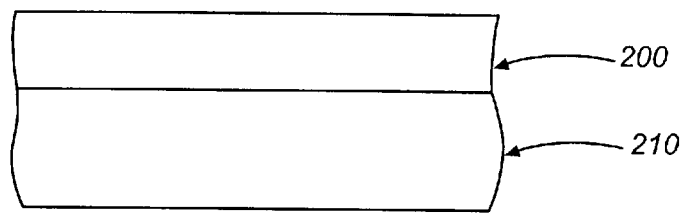
FIG. 2A illustrates a step of depositing a first material layer, such as an oxide, over a substrate layer, such as a silicon wafer, for a method of creating a test structure according to one embodiment of the present invention.
Figure 2B:
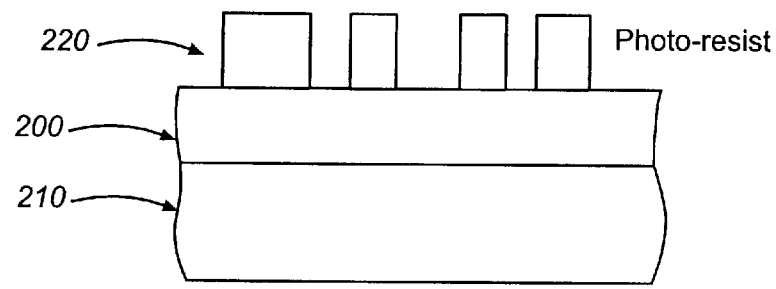
FIG. 2B illustrates a step of placing a photo resistant metal mask over a first material layer, such as an oxide, for a method of creating a test structure according to one embodiment of the present invention.

Referring now to FIGS. 2A through 2D, the steps that comprise a method in accordance with an embodiment of the present invention for fabricating a test structure 100 are illustrated. For purposes of the illustrative method of FIGS. 2A–2D, the layer to be planarized may be an inter-level dielectric layer, though it will be recognized that the layer to be planarized may comprise other optically transparent materials such as a photo resist, polymer, or low K dielectric. FIG. 2A, illustrating a possible first step in creating a test structure 100, shows the step of depositing a first material layer 200, such as oxide in the illustrative embodiment, on a substrate 210 which preferably comprises a silicon wafer. The selection of the material for the first material layer 200 is based on the second material, that is, both materials should be optically matched. Preferably, they comprise substantially the same material. This is in contrast to conventional techniques which deposit a metal layer for forming conductors through subsequent patterning steps. Because optically matched, measurable materials are used for the layers in lieu of traditional materials such as metals, measurements may be taken at any location on the test structure 100. This layer can be deposited using a number of well known techniques, such as chemical vapor deposition (CVI)). FIG. 2B, illustrating a subsequent step in creating a test structure 100, shows the step of fabricating a photo resistant metal mask 220 over the first material layer 200. Alternatively, only other suitable topography inducing level, such as shallow trench isolation, may be utilized. As well known in the industry, the photo resist metal mask can be patterned using photolithography or any other suitable scheme. In a departure from the prior art, where the photo resist metal mark is utilized to pattern an underlying metal layer, the photo resist mark is utilized to pattern the first material layer 200 in accordance with the invention.

Figure 2C:
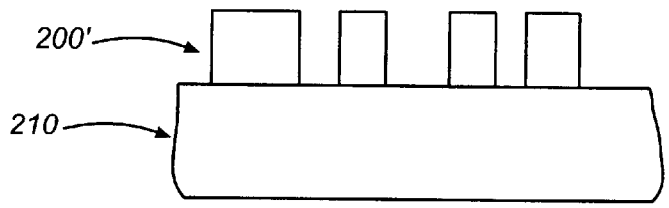
FIG. 2C illustrates a step of etching a first material layer, such as an oxide, for a method of creating a test structure according to one embodiment of the present invention.
Figure 2D:
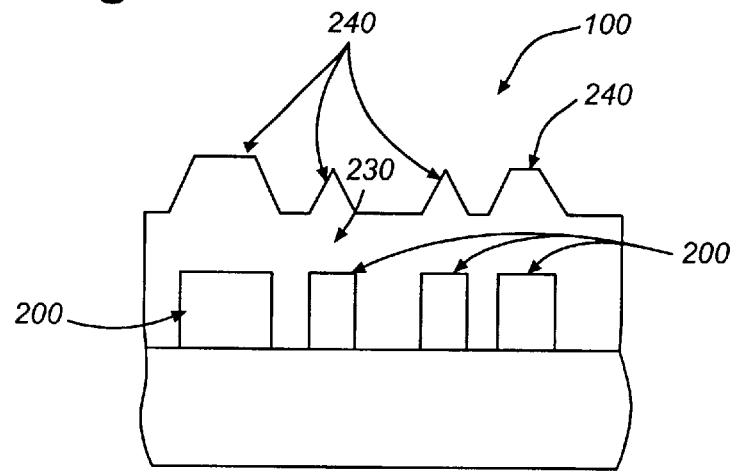
FIG. 2D illustrates a step of depositing a second material layer, such as an oxide, over a patterned first material layer for a method of creating a test structure according to one embodiment of the present invention.

FIG. 2C illustrates the subsequent step of patterning the first material layer 200 to produce a patterned layer 200' using any standard etching technique, such as plasma etching. The patterning step removes portions of the first material layer 200 so that the remaining portions of the first material layer 200 forming the patterned layer 200' resemble the series of peaks and voids corresponding to the placement of the metal mask 220. The photo resistant metal mask 220 is then removed after the etching is complete. FIG. 2D then illustrates the subsequent step of depositing (such as through CVD) an inter-level dielectric layer 230 over the patterned layer 200' which has a topology of peaks and voids as shown in FIG. 2C. In accordance with the present invention, the patterned layer 200' and inter-level dielectric layer 230 are substantially optically matched. That is they comprise substantially the same material such that the optical properties (e.g., extinction coefficient (k) and complex index of refraction, $\check{n}=n(1+ik)$, where n=index of refraction and k=index of attenuation) of the layers are substantially the same and this material should be capable of allowing the light from the optical metrology tool to pass through the material. Therefore, an optical beam emitted from an optical metrology tool is not substantially reflected by the patterned features of the patterned layer 200'. Thus, the patterned layer 200' produces the topology in the inter-level dielectric layer 230 that is to be removed by a planarization system, but does not limit the testing of the of the effectiveness of the planarization system by requiring precise location of the incident light beamed from the optical metrology tool. Referring to FIG. 2D, the effect that the underlying topology of the patterned layer 200' has on the inter-level dielectric layer 230 is illustrated. Specifically, FIG. 2D shows peaks 240 in the inter-level dielectric layer 230 that directly correspond to the peaks in the underlying topology of the patterned layer 200'. These peaks 240 in the inter-level dielectric layer 230 comprise the portion of the inter-level dielectric layer 230 that is preferably removed by planarization techniques such as CMP.

Figure 3:
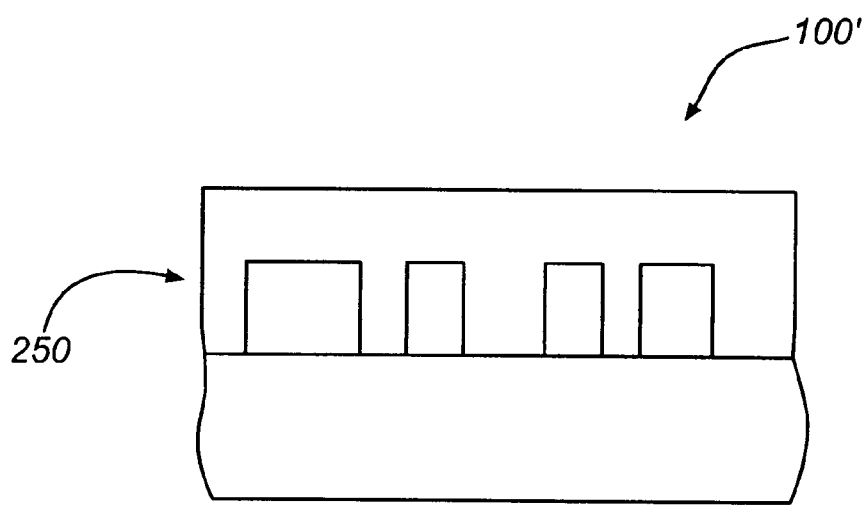
FIG. 3 illustrates a test structure according to one embodiment of the present invention that has been subjected to a planarization system so that thickness measurements may be taken to evaluate the effectiveness of the planarization system.

FIG. 3 shows a test structure 100' in accordance with the present invention that has been subjected to a planarization system. As shown, the topology of the inter-level dielectric layer has been removed by the operation of the planarization system. Thus, the inter-level dielectric layer 230 and the patterned layer 200', collectively referred to as the measured layer 250, of the planarized test structure 100' can be measured using a relatively dense grid covering the full die or any portion thereof to evaluate the effectiveness of the planarization system.

Figure 4:
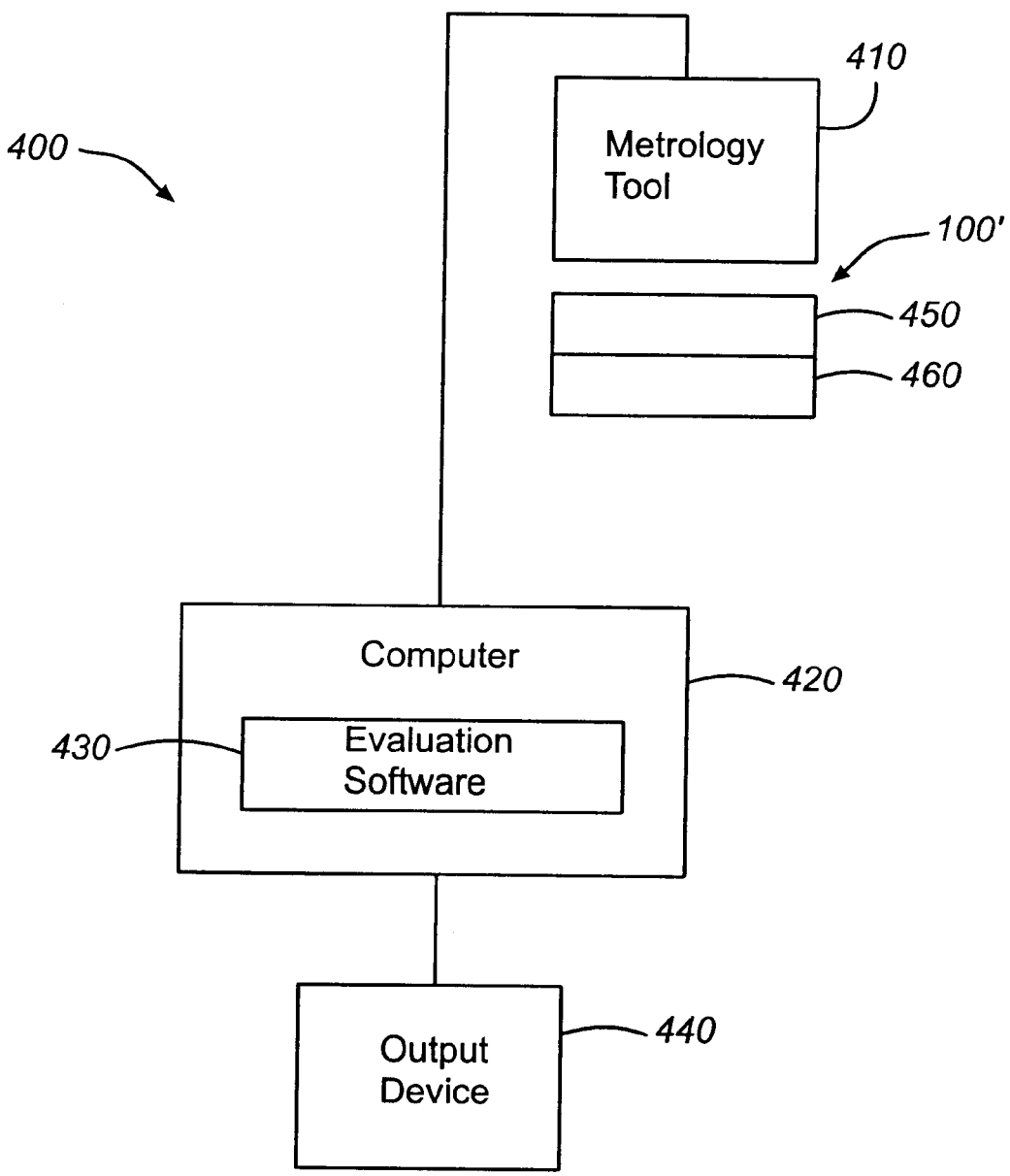
FIG. 4 illustrates a test system according to one embodiment of the present invention which comprises a test structure, such as the one illustrated in FIG. 3, to evaluate the effectiveness of a planarization system.

Referring now to FIG. 4, a test system 400 for evaluating the effectiveness of a planarization system is illustrated. The test system 400 comprises a test structure 100' in accordance with an embodiment of the present invention that has been planarized by the planarization system to be tested, an optical metrology tool 410 that couples to the test structure 100', a computer 420 that is communicatively connected to the optical metrology tool 410, evaluation software 430 that operates on the computer 420, and an output device 440 that is connected to the computer 420 to convey the results of the evaluation software 430.

Utilizing the test system 400, a plurality of measurements over the entire test structure 100' may be taken by the optical metrology tool 410 to obtain an accurate measurement of the thickness over the entire test structure 100'. Because the measured layer 450, i.e., the first material layer and the second material layer, of the test structure 100' comprises essentially a single material, the light from the optical metrology tool 410 will be mostly, if not completely, reflected off the substrate 460 and thereby more accurate measurements will be produced. Additionally, these measurements may be taken in a uniform pattern covering the test structure 100'. The location of the measurement is no longer critical because the optical characteristics of the measured layers 250 is substantially the same over the surface of the test structure 100'. Moreover, the spot size of a typical optical metrology tool is not problematic.

The optical metrology tool 410, such as the OPTI-PROBE by Therma-Wave, Inc., Fremont, Calif. measures the thickness of the measured layers at a plurality of points over the test structure 100'. The OPTI-PROBE, which is but one example of an optical metrology tool 410, uses a monochromatic light source that is a linearly polarized 675 nanometer wavelength diode laser in accordance with the Beam Profile Reflector technique to measure the thickness of the measured layers 250. The thickness measurements and the location of the points over the test structure 100' may be communicated to the computer 420 thereby allowing the software 430 to analyze the measurements taken. The software 430 manipulates the plurality of thickness measurement points and references their location on the test structure 100'. A suitable software package that may be used for analyzing the thickness measurements and that can interface with output devices is MATLAB by Mathworks, Inc. MATLAB may analyze the thickness measurements and their locations to determine how the thickness varies over the entire test structure 100'. MATLAB also allows the measurements to be transformed into tabular reports and multidimensional plots that may be displayed by output devices including printers, monitors, plotters, and other display devices.

Figure 5:
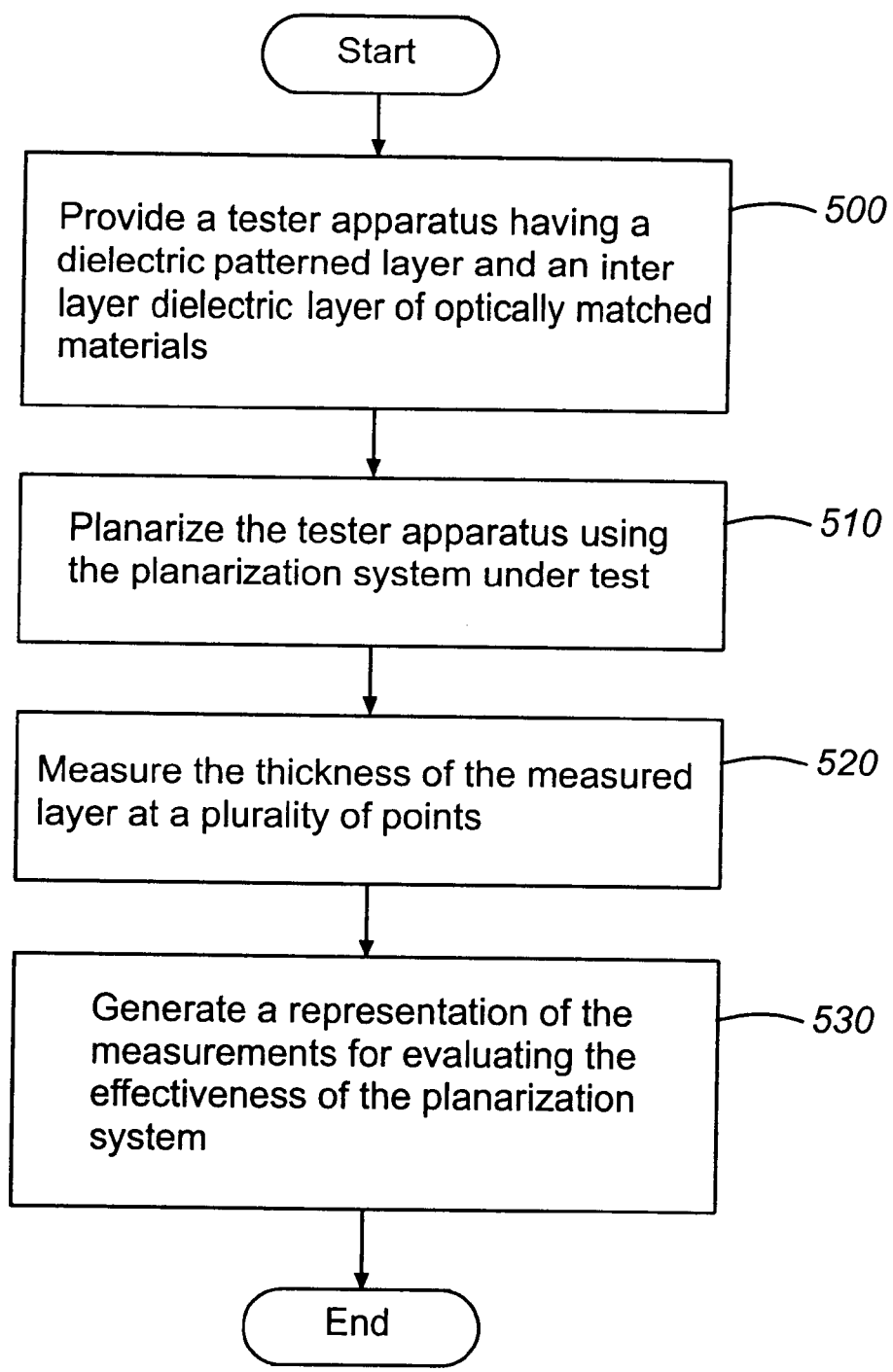
FIG. 5 is a flowchart illustrating a method according to one embodiment of the present invention that may be used to evaluate the effectiveness of a planarization system using a test structure according to the present invention.

Referring now to FIG. 5, a flowchart illustrating a method that is used to evaluate the effectiveness of a planarization system according to one embodiment of the present invention is illustrated. To begin the evaluation process, a test structure, created in accordance with the present invention, is provided as indicated in block 500. The test structure is then planarized by the planarization system under review as indicated in block 510. Measurements are then taken of the thickness of the measured layers (i.e., the first material layer and the second material layer) of the test structure as indicated in block 520. These thickness measurements are then utilized to generate a representation of the measurements (e.g., tabular, graphical, multidimensional plots, etc.) for evaluating the effectiveness of the planarization system during the planarizing step, as indicated in block 530. Obviously, if little variance exists between the thickness measurements of the test structure, then the planarization system that was reviewed performed well. Large variances in the thickness measurements of the test structure shows poor performance.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for fabricating a test structure for evaluating the planarity of a semiconductor wafer structure, comprising:

forming a patterned layer of a first material over a substrate, said patterned layer including a first topology; and depositing a second material over said patterned layer, said second material having a second topology and said first material and said second material being optically matched to reduce reflection by said patterned layer.

2. The method of claim 1, wherein forming a patterned layer comprises patterning the first material with one of a metal level mask technique and a shallow trench isolation topology leveling technique.

3. The method of claim 1, wherein depositing a second material comprises depositing a second material having a second topology substantially corresponding to the first topology.

4. The method of claim 1, wherein depositing a second material comprises depositing a second material that is substantially optically matched to the first material.

* * * * *